(12) United States Patent
Straboni

(10) Patent No.: US 8,975,093 B2
(45) Date of Patent: Mar. 10, 2015

(54) COMPLETE RECRYSTALLIZATION OF SEMICONDUCTOR WAFERS

(75) Inventor: Alain Straboni, Buxerolles (FR)

(73) Assignee: S'Tile, Buxerolles (FR)

( * ) Notice: Subject to any disclaimer, the term of this patent is extended or adjusted under 35 U.S.C. 154(b) by 38 days.

(21) Appl. No.: 13/386,597

(22) PCT Filed: Jul. 22, 2010

(86) PCT No.: PCT/FR2010/051559
§ 371 (c)(1),
(2), (4) Date: Mar. 7, 2012

(87) PCT Pub. No.: WO2011/010074
PCT Pub. Date: Jan. 27, 2011

(65) Prior Publication Data
US 2012/0164760 A1  Jun. 28, 2012

(30) Foreign Application Priority Data
Jul. 24, 2009  (FR) ...................... 09 55179

(51) Int. Cl.
*H01L 21/02* (2006.01)
*H01L 21/324* (2006.01)
*H01L 21/66* (2006.01)
*H01L 21/687* (2006.01)
(Continued)

(52) U.S. Cl.
CPC ............ *H01L 21/02532* (2013.01); *C30B 1/02* (2013.01); *C30B 29/06* (2013.01); *C30B 35/00* (2013.01); *C30B 35/002* (2013.01); *C30B 1/12* (2013.01); *F27D 3/0084* (2013.01); *H01L 21/02667* (2013.01); *H01L 21/67098* (2013.01); *H01L 21/6776* (2013.01)
USPC .......... 438/14; 438/478; 257/E21.529; 117/7; 117/930; 432/209

(58) Field of Classification Search
CPC ..................... H01L 21/67098; H01L 21/6776; H01L 21/02667; H01L 21/02532; C30B 1/02; C30B 1/12; C30B 29/06; C30B 35/00; C30B 35/002
USPC ........... 117/7, 10, 930; 438/14, 478; 432/120, 432/209
See application file for complete search history.

(56) References Cited

U.S. PATENT DOCUMENTS 4,944,835 A * 7/1990 Allen et al. ..................... 117/45
5,470,397 A * 11/1995 Foote et al. ................... 136/260
(Continued)

FOREIGN PATENT DOCUMENTS

DE        3813737 A1   11/1989
WO     2009002550 A1   12/2008

OTHER PUBLICATIONS

Reis, I. et al., "Recrystallized Silicon Thin Film Structures for Solar Cells", Conference Record of the Twentieth IEEE Photovoltaic Specialists Conference, Sep. 26-30, 1988, pp. 1405-1408, XP002571983.
(Continued)

*Primary Examiner* — Mary Wilczewski
(74) *Attorney, Agent, or Firm* — Vedder Price PC

(57) ABSTRACT

The instant disclosure relates to a device and method for recrystallising a silicon wafer or a wafer comprising at least one silicon layer. The silicon wafer or the at least one silicon layer of the wafer is totally molten.

14 Claims, 2 Drawing Sheets

(51) Int. Cl.
*F27D 3/00* (2006.01)
*H01L 21/67* (2006.01)
*H01L 21/677* (2006.01)
*C30B 1/02* (2006.01)
*C30B 29/06* (2006.01)
*C30B 35/00* (2006.01)
*C30B 1/12* (2006.01)

(56) References Cited

U.S. PATENT DOCUMENTS 5,741,359 A * 4/1998 Motoda et al. .................. 117/43
2010/0295061 A1 * 11/2010 Sachs et al. ..................... 257/77
2012/0164760 A1 * 6/2012 Straboni ......................... 438/14

OTHER PUBLICATIONS

Written Opinion of the International Searching Authority issued in PCT/FR2010/051559 on Feb. 7, 2012, including English translation of the document.
"Recrystallized silicon thin film structure for solar cells" Reis, et al., Conference Record of the Twentieth IEEE Photovoltaic Specialists Conference—1988, Cat. No. 88CH2527-0, Sep. 26-30, 1988, Las Vegas, NV, (Jan. 1, 1988), pp. 1405-1408, vol. XP002571983 Conference Record of the Twentieth IEEE Photovoltaic Specialists Conference—1988, IEEE New York NY USA, Section "Recrystallization of Si-layers", "Results".

* cited by examiner

COMPLETE RECRYSTALLIZATION OF SEMICONDUCTOR WAFERS

FIELD OF THE INVENTION

The present invention relates to semiconductor wafers intended for various fields of electronics, such as microelectronics, optoelectronics, photovoltaics, etc.

DISCUSSION OF PRIOR ART

In unpublished French patent application No. 09/52110 of the same inventor, entitled "Structure électronique à couche épitaxiée sur silicium fritté", the applicant describes a method comprising a step of surface recrystallization of silicon wafers obtained by sintering of silicon powders. Such wafers, after partial recrystallization, comprise an area with large grains and an area with small grains. The area with small grains comprises many grain boundaries, which is for example prejudicial in photovoltaics since the created electron-hole pairs may be trapped therein, which decreases the efficiency.

This same French patent application discusses a zone melting method (ZMR), in which a small moving area is melted across the entire thickness of the wafer. This method generates lengthened, or even filiform, silicon grains, in the direction of the displacement of the melted area. The wafer also comprises many grain boundaries, which causes operating disturbances. Further, this "ZMR" method, difficult to implement, is very slow, the processing speed ranging from a few millimeters to a few centimeters per minute.

A prior art method for obtaining silicon wafers having large grains in all directions is to provide a silicon melt which cools down very slowly. The ingot is then sawn into wafers. This method is not advantageous since is lengthy and expensive.

One of the objects of the present invention is to overcome these disadvantages by providing an advantageous method and/or device providing semiconductor wafers having large grains. "Large grains" means macroscopic grains, for example, ranging from a few millimeters to a few centimeters. "Small grains" means grains invisible to the naked eye, for example from 1 to 100 micrometers.

Another object of the present invention is to overcome all or part of the disadvantages of prior art, and/or to provide alternatives to prior art methods and/or devices.

SUMMARY

Thus, an embodiment of the present invention provides a method for recrystallizing a silicon wafer or a wafer comprising at least one silicon layer. The method comprises:
  a) a melting step during which the silicon wafer or the at least one silicon layer is totally melted; and
  b) a step of recrystallization of the silicon of the wafer, whereby the wafer has silicon grains of millimetric and/or centimetric size.

According to an embodiment of the present invention, the wafer is placed between two counter-plungers having a surface to which molten silicon cannot bond.

According to an embodiment of the present invention, a pressure measurement is performed by means of a pressure sensor and/or a displacement measurement is performed by means of a displacement sensor, to spot the beginning of the melting and the time from which the silicon melting is complete.

According to an embodiment of the present invention, the relative displacement of the counter-plungers is limited by at least one packing block.

According to an embodiment of the present invention, a force is applied to the wafer.

According to an embodiment of the present invention, the intensity of the force is controlled by the silicon melting state.

According to an embodiment of the present invention, the method comprises a step of gas injection for doping, purification, or cooling of the wafer.

The present invention also provides a device for recrystallizing a silicon wafer or the silicon of a wafer comprising at least one silicon layer. The device comprises:
  a) means for fully melting the silicon of the wafer; and
  b) confinement means for avoiding the flowing of silicon.

According to an embodiment of the present invention, the confinement means comprise two counter-plungers having a surface to which molten silicon cannot bond.

According to an embodiment of the present invention, the counter-plungers comprise a graphite core, a silicon carbide barrier layer, and a silicon nitride or boron nitride contact layer.

According to an embodiment of the present invention, the device comprises at least one pressure sensor capable of measuring a pressure exerted on the wafer and/or at least one displacement sensor capable of measuring the distance between counter-plungers.

According to an embodiment of the present invention, the device comprises at least one packing block arranged between the counter-plungers.

According to an embodiment of the present invention, the device comprises means enabling to apply a force on the wafer.

According to an embodiment of the present invention, the device comprises means capable of controlling the intensity of the force with the silicon melting state.

The present invention also provides a tunnel enabling to continuously process wafers to be recrystallized, comprising:
  a first area comprising means for pre-heating at least one wafer;
  a second area comprising means enabling the wafer silicon to fully melt; and
  a third area comprising means enabling to recrystallize the silicon of the wafer.

BRIEF DESCRIPTION OF THE DRAWINGS

The foregoing and other objects, features, and advantages of the present invention will be discussed in detail in the following non-limiting description of specific embodiments in connection with the accompanying drawings, among which.

DETAILED DESCRIPTION

Figure 1:
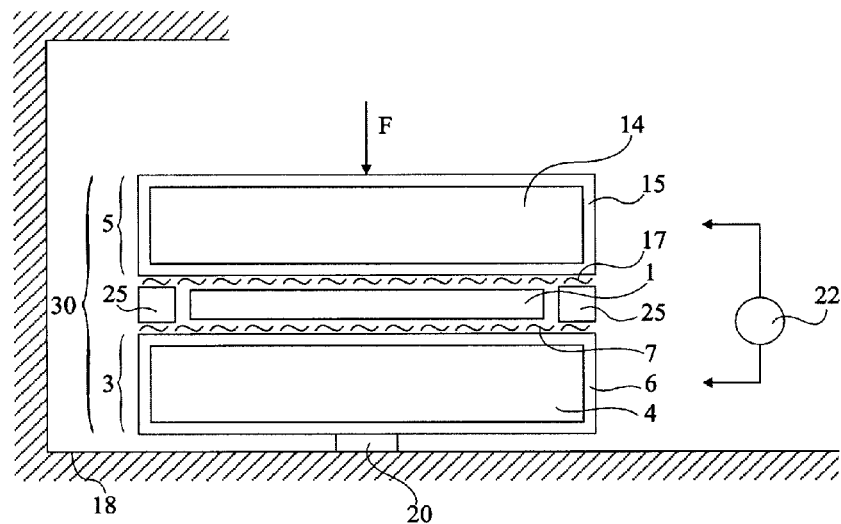
FIG. 1 illustrates a method according to the present invention.

For clarity, the same elements may have been designated with the same reference numerals in the different drawings and the various drawings are not to scale.

The principle of the present invention is to fully melt silicon wafers or fully melt the silicon portion of a wafer. "Full melting" means the simultaneous or almost simultaneous melting of the entire silicon volume of the wafer.

The wafer thickness is not critical. For example, it may range between 100 and 500 micrometers. The thickness may also range up to several millimeters, for example, in photovoltaic applications, or more when, for example, the wafer comprises a support which is not made of silicon.

After the full melting of silicon, the wafer is recrystallized, and macroscopic silicon grains having a large surface size in all directions then form. If the wafer is only made of silicon, the grains are through, that is, they span from one surface of the wafer to the other. The recrystallization is very fast. As soon as the wafer temperature has fallen below the silicon melting temperature, the wafer almost immediately recrystallizes over its entire surface (typically within on the order of one second or of a few seconds).

The solution retained in the present invention (complete melting of the silicon of the wafer) is thus fast. It is thus simple to implement, and of low cost. For example, the melting may be performed in a continuous furnace, which consumes little power.

Other advantages of the present invention will appear from the following description.

FIG. 1 shows an example of a wafer recrystallization device according to the present invention. It should be noted that the device of FIG. 1 is an example only and that it should by no means limit the present invention such as defined in the claims.

In FIG. 1, a wafer 1 to be recrystallized is placed between a lower counter-plunger 3 and an upper counter-plunger 5.

Wafer 1 is a wafer of any kind, comprising silicon that needs recrystallizing. It will however be assumed that the wafer to be processed in FIG. 1 is a wafer entirely made of silicon, for example, a small-grain wafer obtained by sintering of silicon powders.

Counter-plunger 3 comprises a ceramic core 4, for example, made of graphite. Ceramic core 4 is surrounded with a barrier layer 6 made of silicon carbide (SiC) of small thickness, for example, approximately 100 micrometers, to prevent the carbon of core 4 from contaminating the silicon wafer. A so-called contact layer 7, which aims at preventing the bonding of wafer 1 to barrier layer 6, is placed on barrier layer 6. Contact layer 7 may for example be formed of silicon nitride or of boron nitride, which materials have a low affinity for liquid silicon. The thickness of contact layer 7 is small, typically on the order of 5 micrometers.

Counter-plunger 5 comprises a ceramic core 14, for example, made of graphite. As in the case of counter-plunger 3, counter-plunger 5 also comprises a barrier layer 15 and a contact layer 17 having the same features as barrier layer 6 and contact layer 7.

Contact layers 7 or 17 may be formed by spraying of powders mixed with a liquid, by CVD (chemical vapor deposition) or by vacuum deposition.

Counter-plungers 3 and 5 may have a large thickness, but a few millimeters are typically sufficient. The length and the width of counter-plungers 3 and 5 are sufficient to contain the entire wafer 1. Counter-plungers 3 and 5 are arranged in such a way that they remain parallel when the silicon melts.

Wafer 1 may be large. For example, wafer 1 may have the shape of a square of 10 cm by 10 cm, or of 15 cm by 15 cm. If wafer 1 results from the sawing of an ingot, it may be as large as the entire sawn surface, its diameter having at most the ingot diameter. If the wafer is made from sintered silicon powders, it may have any shape and size.

Counter-plungers 3 and 5 may be made of a ceramic other than graphite. They may be of same nature or of different nature. Barrier layers 6 and 15 may be absent if there is no or little risk of wafer contamination by the material of counter-plungers 3 and 5. Contact layers 7 and 17 may be absent if the counter-plungers are made of a material which allows no bonding of the liquid silicon. For example, counter-plungers 3 and 5 may be made of boron nitride BN, since boron nitride does not bond to molten silicon. Preferably, in this case, the boron nitride will be pyrolytic boron nitride, that is, deposited by CVD, since pyrolytic boron nitride is more stable and purer than boron nitride obtained by other techniques.

In FIG. 1, lower counter-plunger 3, wafer 1, and counter-plunger 5 form an assembly 30 which is placed in an enclosure 18, incompletely shown.

In FIG. 1, a pressure sensor 20 is arranged between lower counter-plunger 3 and the base of enclosure 18. A displacement sensor 22 is arranged to allow a measurement of the relative motion of the upper counter-plunger with respect to the lower counter-plunger. A force F may be applied on upper counter-plunger 5.

In FIG. 1, packing blocks 25, having a size slightly smaller than the thickness of wafer 1, are arranged between counter-plungers 3 and 5 on either side of wafer 1. For example, if wafer 1 has a 500-micrometer thickness, blocks 25 may have a 450-micrometer thickness. Blocks 25 may be made of boron nitride.

Force F may be applied to upper counter-plunger 5 by a plunger, not shown, external to enclosure 18. Force F may also be applied by two plungers external to enclosure 18, not shown, an upper plunger acting on counter-plunger 5 and a lower plunger acting on counter-plunger 3.

Sensors 20 and 22 may also be placed in other locations, for example, outside of enclosure 18, or in a portion thereof which will remain relatively cold. The displacement sensor, intended to measure the variation of the interval between counter-plungers 3 and 5, may have a single measurement point, for example, if one of the two counter-plungers is fixed with respect to the enclosure.

In FIG. 1, under lower counter-plunger 3, a thermal insulator, not shown, may be placed to avoid thermal losses.

Before examining various possible operating modes of the device of FIG. 1, the usefulness of packing blocks 25 and of sensors 20 and 22 will be generally discussed.

Packing blocks 25 are not essential. Packing blocks 25 are generally only necessary when the applied force is strong, since the displacement of the upper counter-plunger with respect to the lower counter-plunger may become too large and make it impossible to use the wafer. Thus, too high an applied force without the presence of packing blocks may cause the bonding of silicon to counter-plungers 3 and 5, despite the presence of contact layers 7 and 17.

When used, packing blocks 25 limit the displacement of the upper counter-plunger with respect to the lower counter-plunger. Blocks 25 also enable to be absolutely sure that the surfaces of the recrystallized wafer are strictly planar and parallel, in cases where the upper counter-plunger bears against blocks 25.

Packing blocks 25 may be non-contiguous and distributed around wafer 1. For example, blocks 25 are by the number of 4. A single one may also be used. Blocks 25 may be contiguous and entirely surround wafer 1. They then form a barrier against a possible flowing of the wafer.

Pressure and/or displacement sensors 20 and 22 are not essential. Generally, the pressure and/or displacement sensors may appear to be unnecessary if the processing conditions are well defined, as in a series production, or if it is possible to use temperature sensors reliably indicating whether the entire wafer has fully melted.

When used, sensors 20 and/or 22 have the function of detecting, on the one hand, the beginning of the melting and, on the other hand, the time when the melting is complete, that is, when all the silicon has melted.

Indeed, as soon as the silicon starts softening and/or that molten silicon islands start forming within the wafer, the measurements provided by the pressure sensor or by the displacement sensor generally slightly decrease. This decrease is small, but however noticeable. According to the conditions (value of force F, temperature rise time, sensitivity and/or position of the sensors, etc), the first measurement to vary is that of the pressure sensor or that of the displacement sensor, and may be used to detect the beginning of the melting.

The pressure sensor and/or the displacement sensor also enable to detect the time when the melting is complete. Indeed, when all the silicon has melted, the pressure sensor and/or the displacement sensor indicate a very clear variation, much stronger than at the beginning of the melting. Detecting the time when the melting is complete may be useful in certain operating modes of the device of FIG. 1.

A first operating mode of the device of FIG. 1 in which force F is constant during the processing will now be described.

After the positioning of wafer 1 as shown in FIG. 1, a constant force F is applied to upper counter-plunger 5. For example, force F is provided by a mass M laid on counter-plunger 5. Force F is transmitted to the wafer and the resistance of the solid silicon of the wafer opposes force F.

Then, the temperature of the enclosure is increased so that wafer 1 is totally melted. To achieve this, the enclosure is brought to a temperature greater than the melting temperature of silicon. In practice, it is sufficient for the temperature of the enclosure to be greater by a few degrees than the melting temperature of silicon, for example, 1,420° C., to be sure that each area of wafer 1 reaches the melting temperature of silicon. Higher temperatures may of course be used.

Wafer 1 does not instantaneously melt. The pressure sensor and/or the displacement sensor give information as to the beginning of the melting. As soon as it starts softening, the silicon opposes less to force F and the distance between counter-plungers decreases.

When the entire silicon of the wafer has melted, which may be indicated by the pressure and/or temperature sensors, the temperature having enabled the melting is maintained for a short time, such as from one to a few minutes, to be absolutely sure that there remain no non-melted silicon islands having escaped the detection. It should be noted that the silicon flowing generally starts when the wafer is fully melted. As a result of this flowing, silicon drops may form at the edge of wafer 1 and cause drips starting from the wafer, which are removed after the processing.

It should be noted that, when the wafer has melted, a gas may be injected at the wafer level or elsewhere in the enclosure for wafer doping or purification purposes. The gas may be diborane or phosphine gas for a respective boron or phosphorus doping. To purify the wafer, a reactant gas such as a mixture of hydrogen and argon or any gas or gas mixture may be used as discussed in French patent application No. 08/55149 of the same inventor.

Then, the recrystallization step is started. For this purpose, the temperature is taken down below the melting temperature of silicon, for example, by cutting off the heating. A cold gas, for example, at ambient temperature, may be injected at the wafer level to accelerate the recrystallization. The gas may be an inert gas such as argon. A reactant gas, for example, hydrogen, which will decrease oxygen concentrations, may also be used.

The recrystallization is fast. The recrystallization time is mainly limited by the thermal inertia of the counter-plungers, having a temperature which must fall below the melting temperature of silicon, which amounts to a decrease of some ten degrees if they had been taken up to 1,420° C.

The recrystallization speed, which controls the size of the crystals, may be controlled by controlling the temperature decrease rate. The recrystallization speed may also be controlled by the control of the flow and of the temperature of the injected gas.

As soon as there is no further danger as to the wafer surface condition, for example, a few minutes after the gas injection, force F is released by being taken down to zero. It should be noted that, preferably, as long as the entire wafer surface has not been fully recrystallized, it is avoided to release the applied force, since if a surface area had remained liquid, the occurrence of a waviness at the surface wafer might be observed.

After the cooling, the recrystallized wafer is taken out of the enclosure.

It should be noted that the counter-plunger which will move down first under the silicon melting temperature can be selected, for example, by sending the cold gas flow on one of the counter-plungers, for example on the lower plunger. The wafer surface adjacent to the cooled counter-plunger then recrystallizes first and is used as a seed surface. This may be advantageous since, given that the seed surface is used as a starting point for crystals, this enables to have larger crystals on the other surface.

A second operating mode of the device of FIG. 1 in which force F varies during the processing will now be described.

In the second operating mode, the packing blocks are not necessary since the silicon flowing is controlled by means of a control of force F by the silicon melting state.

In the second operating mode, force F is set to an initial value F0 before the enclosure temperature rises. As soon as the beginning of the melting has been detected, the intensity of force F is progressively decreased so that it reaches a residual value F1 when the melting is complete. Residual force F1 is sufficiently strong to prevent the forming of a waviness at the surface of the silicon wafer and sufficiently low to prevent a significant flowing of the silicon. For example, the intensity of force F1 may be on the order of 300 newtons for a wafer of 10 centimeters by 10 centimeters.

The control of the intensity of force F with the wafer melting state may be performed in various ways.

For example, sensor 20 and/or sensor 22 may be used and the intensity of the force may be set based on the data provided by the sensors.

Force F may also be a force having an intensity which is automatically set according to the wafer melting state. For example, if force F is exerted by resilient means such as a spring, the decrease in the distance between counter-plungers 3 and 5 causes a decrease in the intensity of force F.

The expansion of the counter-plungers may also be used to exert force F. Thus, by positioning the plungers at a given distance from each other, the counter-plungers may be made to get closer until a pressure is exerted on the silicon, by for example taking the temperature up to 1,420° C. When the wafer is cooled down to a temperature of 1,400° C., for example, the contraction of the counter-plungers enables to release force F.

The variation of force F may be continuous or staged. For example, force F may directly pass from value F0 to value F1 as soon as the silicon starts melting.

Further, in the second operating mode, the rest of the process occurs in the same way as in the first operating mode.

Various other operating modes and/or modifications of the device of FIG. 1 will occur to those skilled in the art.

For example, several pressure sensors and/or several displacement sensors may be used.

For example, as a complement to the confinement measures taken to avoid the flowing of silicon, the surface waviness of the fully melted wafer may be decreased by growing on the wafer, or by surrounding it, before the processing, with a silicon oxide layer $SiO_2$, for example having a 100-nanometer thickness. The oxide layer no longer melts on melting of the silicon and opposes, to some extent, to the flowing of silicon. The oxide layer may of course be removed after processing.

Figure 2:
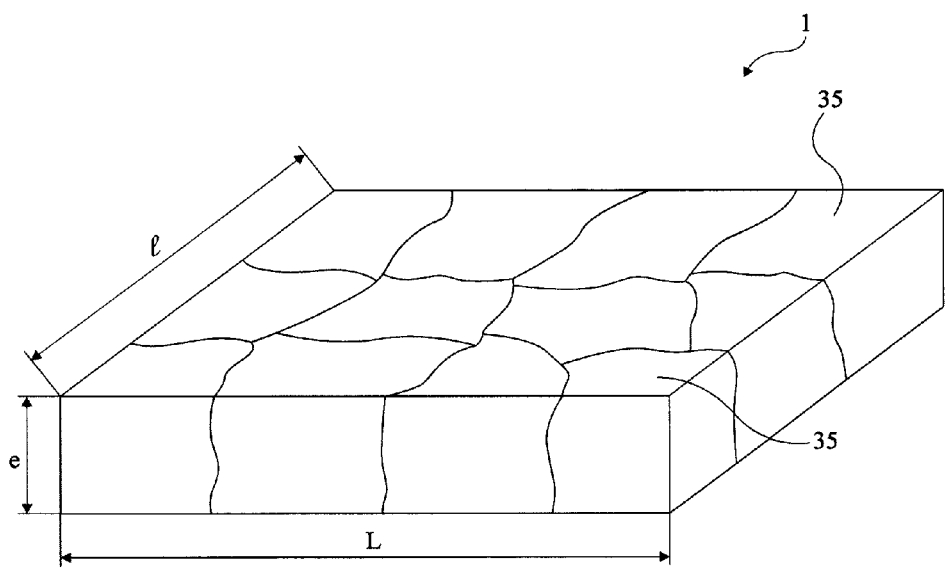
FIG. 2 shows a wafer obtained by the method of FIG. 1.

FIG. 2, which shows a wafer 1 after recrystallization, will now be described.

Wafer 1 has a thickness e for example ranging between 100 and 500 micrometers, as well as a centimetric to decimetric length L and width 1. This wafer has large crystals 35 on the upper surface of the wafer, which cross the entire thickness e of the wafer. At the surface level, the size of crystals 35 typically ranges from a few millimeters to a few centimeters in all directions.

Different types of wafers that can be recrystallized according to the present invention will now be described.

First, as said previously, wafers made by sintering of silicon powders may be used.

Silicon wafers of poor quality, such as inhomogeneous wafers or wafers with small grains, for example, because they originate from ingots which have cooled down rapidly or unevenly, may also be recrystallized. Such wafers, after recrystallization according to the present invention, will provide high-performance wafers with large silicon grains.

The method according to the present invention may be integrated in a large-grain silicon wafer manufacturing method comprising a fast and inexpensive step of manufacturing of small-grain silicon ingots and a fast and inexpensive step of recrystallization according to the present invention of the wafers obtained after sawing of the ingot.

Wafers comprising a silicon support of poor quality topped with an active pure silicon layer may also be recrystallized. The support may have small grains and result from the sintering of metallurgical silicon powders and the pure silicon layer may have been deposited in the form of a layer of sintered powders, of a layer deposited by spraying, or by CVD or vacuum deposition.

Wafers comprising a ceramic support, for example, made of silicon carbide SiC, of silicon nitride $Si_3N_4$, or of mullite, an alloy of ceramics, topped with an active pure small-grain silicon layer, obtained by chemical vapor deposition, may also be recrystallized. The silicon portion of this wafer is recrystallized by a method according to the present invention, that is, the active layer is totally melted, and will form large crystals as it recrystallizes. The ceramic support does not melt, and the lower counter-plunger may be omitted since the wafer already has a base capable of supporting the molten silicon.

Generally, any semiconductor wafer comprising a small-grain silicon layer can advantageously be recrystallized according to the present invention.

Figure 3:
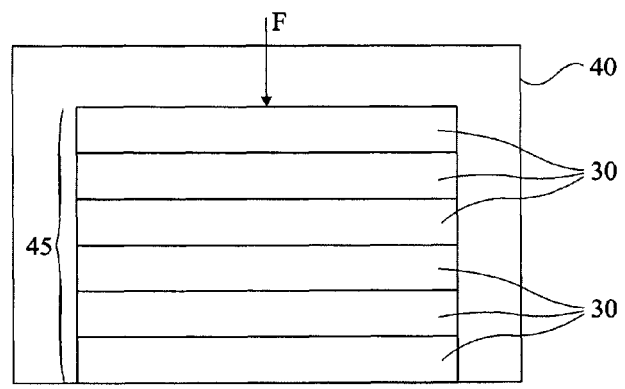
FIGS. 3 and 4 show devices according to the present invention.

FIG. 3 will now be described.

FIG. 3 shows an enclosure 40 comprising a stack 45 of assemblies 30 of FIG. 1, each assembly 30 comprising a wafer to be recrystallized surrounded with a lower counter-plunger and with an upper counter-plunger. It goes without saying that the upper counter-plunger of a wafer and the lower counter-plunger of the wafer located above may be the same single counter-plunger. Force F, if present, is exerted on stack 45. The possible pressure and/or displacement sensors are not shown in FIG. 3. The operation of the device of FIG. 3 can easily be deduced from the operation of the device of FIG. 1 and will not be described any further. The device of FIG. 3 enables to recrystallized several wafers at the same time.

Figure 4:
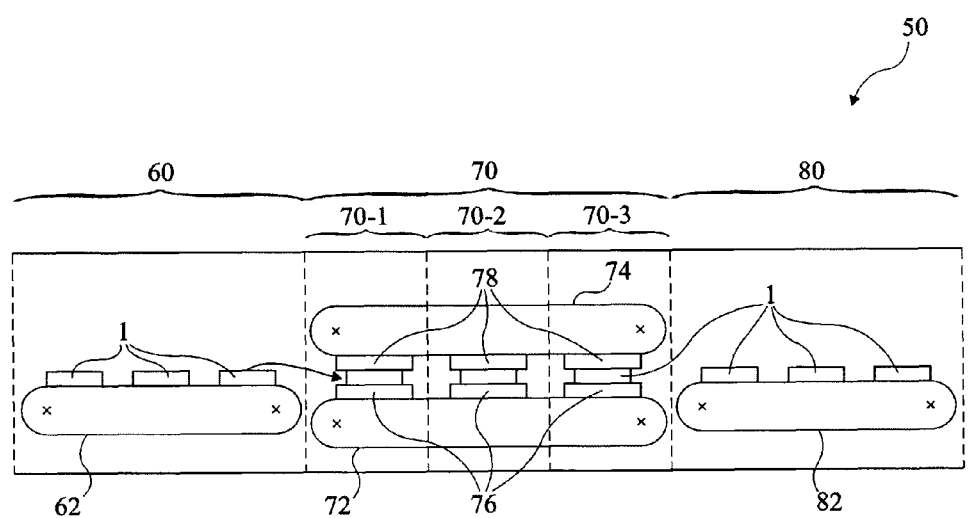

FIG. 4 shows a continuous wafer recrystallization tunnel 50.

In FIG. 4, tunnel 50 comprises a preheating area 60, a quasi-isotherm area 70, and a cooling area 80.

In area 60, wafers 1 to be recrystallized are driven by a transport tape 62. In area 60, the temperature progressively increases to reach a high temperature lower than the melting temperature of silicon, for example, ranging between 1,350 and 1,400° C.

A lower transport tape 72 and an upper transport tape 74 are present in area 70. Lower transport tape 72 comprises confinement elements 76, where each element 76 may have the shape and the nature of counter-plunger 3 of FIG. 1. Upper transport tape 74 comprises confinement elements 78, where each element 78 may have the shape and the nature of counter-plunger 5 of FIG. 1. Area 70 comprises three sections, bearing reference numerals 70-1, 70-2, and 70-3.

Section 70-1 is an area into which the wafers are transferred when they reach the end of transport tape 62, each wafer 1 being placed between a confinement element 76 and a confinement element 78. Section 70-1 is taken to a temperature close to the melting temperature of silicon.

Transported by transport tapes 72 and 74, the wafer passes from section 70-1 to section 70-2. Section 70-2 is taken to a temperature greater than the melting temperature of silicon, for example, 1,420° C. In section 70-2, the silicon of wafer 1 has fully melted. This can be ascertained either by providing displacement and/or pressure sensors, or by providing a sufficient time of passage through section 70-2.

Then, the wafer passes from section 70-2 to section 70-3. The temperature in section 70-3 is lower than the melting temperature of silicon while remaining close to it. The wafer, still located between confinement elements 76 and 78, starts cooling down and recrystallizing.

The possible addition of gas is not shown. Force F generally applied to the wafer in area 70, or at least in section 70-3, is not shown. Force F may for example be generated by acting on transport tape 74, for example, by means of rollers, or simply by the tension of transport tapes 72 and 74. An additional mass may also be laid on the wafers during their travel through area 70. In this case, upper transport tape 74 may be unnecessary. Possible packing blocks are not shown in FIG. 4.

As it comes out of section 70-3, wafer 1, which has started crystallizing and has planar surfaces which will no longer deform, is transferred into area 80 on a transport tape 82 which transports the wafers alone. In this section, the confinement elements are not necessarily useful. Area 80 corresponds to the end of the cooling and the wafer temperature progressively decreases until the end of the tunnel.

It will of course be within the abilities of those skilled in the art to adapt the various elements of device 50.

For example, it can be considered that transport tapes 72 and 74 may stop for a few moments at the time of the melting in section 70-2. Of course, rows of several wafers may be arranged on the transport tapes and be processed at the same time. Also, transport tapes 62, 72, and 82 may form a single transport tape comprising confinement elements 76, each wafer being placed on an element 76 as it enters the tunnel.

Various embodiments with different variations have been described hereabove. It should be noted that those skilled in the art may modify or combine various elements of these various embodiments and variations without showing any inventive step.

It should in particular be noted that the wafers to be recrystallized are not necessarily pure silicon wafers, but that the wafers may be doped before being melted or recrystallized.

Also, although the present invention has been described in the case of the recrystallization of the silicon of wafers, other types of wafers may also be recrystallized, such as wafers comprising a silicon- and germanium-based alloy.

The invention claimed is:

1. A method for recrystallizing a silicon wafer or a wafer comprising at least one silicon layer, comprising:
    a melting step during which the silicon wafer or the at least one silicon layer is fully melted, confinement means comprising a material not adherent to silicon, the confinement means forming an integral part of a device used for the melting step, wherein a pressure measurement is performed by means of a pressure sensor and/or a displacement measurement is performed by means of a displacement sensor, to spot the beginning of the melting and the time from which the silicon melting is complete; and
    a step of recrystallization of the wafer silicon, whereby the wafer has silicon grains of millimetric and/or centimetric size.

2. The method of claim 1, wherein the confinement means comprises two counter-plungers, and the wafer is placed between the two counter-plungers having the material not adherent to silicon.

3. The method of claim 2, wherein the relative displacement of the counter-plungers is limited by at least one packing block.

4. The method of claim 1, wherein a force is applied to the wafer.

5. The method of claim 4, wherein the intensity of the force is controlled by the silicon melting state.

6. The method of claim 1, comprising a step of gas injection for wafer doping, purification, or cooling of the wafer.

7. A device for recrystallizing a silicon wafer or the silicon of a wafer comprising at least one silicon layer, the device comprising:
    means for fully melting the silicon of the wafer;
    confinement means comprising a material not adherent to silicon, the confinement means comprising a material not adherent to silicon; and
    at least one pressure sensor capable of measuring a pressure exerted on the wafer and/or at least one displacement sensor capable of measuring the distance between counter-plungers.

8. The device of claim 7, wherein confinement means comprise two counter-plungers having a surface to which molten silicon cannot bond.

9. The device of claim 8, wherein the counter-plungers comprise a graphite core, a silicon carbide barrier layer, and a silicon nitride or boron nitride contact layer.

10. The device of claim 8, comprising at least one packing block arranged between the counter-plungers.

11. The device of claim 7, comprising means enabling to apply a force to the wafer.

12. The device of claim 11, comprising means capable of controlling the intensity of the force with the silicon melting state.

13. A method for recrystallizing a silicon wafer or a wafer comprising at least one silicon layer, comprising:
    a melting step during which the silicon wafer or the at least one silicon layer is fully melted; and
    a step of recrystallization of the wafer silicon, whereby the wafer has silicon grains of millimetric and/or centimetric size,
    wherein a pressure measurement is performed by means of a pressure sensor and/or a displacement measurement is performed by means of a displacement sensor, to spot the beginning of the melting and the time from which the silicon melting is complete.

14. A device for recrystallizing a silicon wafer or the silicon of a wafer comprising at least one silicon layer, the device comprising:
    means for fully melting the silicon of the wafer;
    confinement means comprising a material not adherent to silicon, the confinement means forming an integral part of the device; and
    at least one pressure sensor capable of measuring a pressure exerted on the wafer and/or at least one displacement sensor capable of measuring the distance between counter-plungers.

* * * * *